(12) United States Patent
Herrault et al.

(10) Patent No.: US 11,721,605 B2
(45) Date of Patent: Aug. 8, 2023

(54) WAFER-LEVEL INTEGRATED MICRO-STRUCTURED HEAT SPREADERS

(71) Applicant: HRL Laboratories, LLC, Malibu, CA (US)

(72) Inventors: Florian G. Herrault, Agoura Hills, CA (US); Chia-Ming Chang, Agoura Hills, CA (US)

(73) Assignee: HRL LABORATORIES, LLC, Malibu, CA (US)

( * ) Notice: Subject to any disclaimer, the term of this patent is extended or adjusted under 35 U.S.C. 154(b) by 67 days.

(21) Appl. No.: 17/345,927

(22) Filed: Jun. 11, 2021

(65) Prior Publication Data

US 2022/0093484 A1     Mar. 24, 2022

Related U.S. Application Data

(60) Provisional application No. 63/082,654, filed on Sep. 24, 2020.

(51) Int. Cl.
*H01L 23/367*     (2006.01)
*H01L 21/48*      (2006.01)
*H01L 21/683*     (2006.01)

(52) U.S. Cl.
CPC ...... *H01L 23/3672* (2013.01); *H01L 21/4882* (2013.01); *H01L 21/6835* (2013.01)

(58) Field of Classification Search
CPC ............. H01L 23/3672; H01L 21/4882; H01L 21/6835; H01L 2221/68345; H01L 21/4871; H01L 23/3677; H01L 23/367
USPC ....................................................... 257/717
See application file for complete search history.

(56) References Cited

U.S. PATENT DOCUMENTS

| | | | | |
|---|---|---|---|---|
| 7,671,467 B2* | 3/2010 | Nonaka | ................. | H05K 1/0271 257/711 |
| 7,855,449 B2* | 12/2010 | De Graff | ................. | F28F 21/04 257/E23.113 |
| 8,223,496 B2* | 7/2012 | Soda | ....................... | H01L 25/18 257/684 |

(Continued)

FOREIGN PATENT DOCUMENTS

| | | | |
|---|---|---|---|
| KR | 10-2015-0058940 A | | 5/2015 |
| KR | 10-2020-0079898 A | | 7/2020 |

OTHER PUBLICATIONS

PCT International Search Report and Written Opinion from PCT/US2021/036962 dated Sep. 30, 2021.

*Primary Examiner* — Vu A Vu
(74) *Attorney, Agent, or Firm* — Ladas & Parry, LLP

(57) ABSTRACT

An electronic assembly including: a wafer defining at least one cavity; a chip disposed in the cavity; and a metal heat spreader disposed in the cavity, the chip being embedded in the metal heat spreader; wherein the metal heat spreader has at least one elongate microstructure separated from a remainder of the metal heat spreader by at least one channel; wherein the metal heat spreader occupies an area within the cavity that is not occupied by the chip; and wherein the at least one elongate microstructure is configured and arranged in the cavity so as to improve thermal management of the chip by reducing stress across the chip as compared with a configuration and arrangement in which a heat spreader made of the metal and occupying the area within the cavity is a solid without channels. Also, a method for forming the electronic assembly.

24 Claims, 10 Drawing Sheets

(56) References Cited

U.S. PATENT DOCUMENTS

| | | |
|---|---|---|
| 8,431,438 B2 * | 4/2013 | Nalla ................. H01L 23/36 |
| | | 257/E23.067 |
| 8,617,927 B1 | 12/2013 | Margomenos et al. |
| 9,214,404 B1 | 12/2015 | Margomenos et al. |
| 9,337,124 B1 | 5/2016 | Herrault et al. |
| 9,355,985 B2 * | 5/2016 | Vincent ............... H01L 23/367 |
| 9,485,891 B2 * | 11/2016 | Huesgen ............. H05K 5/0091 |
| 9,508,652 B1 | 11/2016 | Herrault et al. |
| 9,825,116 B1 * | 11/2017 | Herrault ............. H01L 21/3081 |
| 9,842,814 B1 | 12/2017 | Herrault et al. |
| 10,026,672 B1 | 7/2018 | Herrault et al. |
| 10,483,184 B1 | 11/2019 | Herrault et al. |
| 2008/0315398 A1 * | 12/2008 | Lo ..................... H01L 23/5389 |
| | | 257/706 |
| 2012/0171814 A1 | 7/2012 | Choi |
| 2015/0118794 A1 | 4/2015 | Lin |
| 2017/0125318 A1 | 5/2017 | Harr |

* cited by examiner

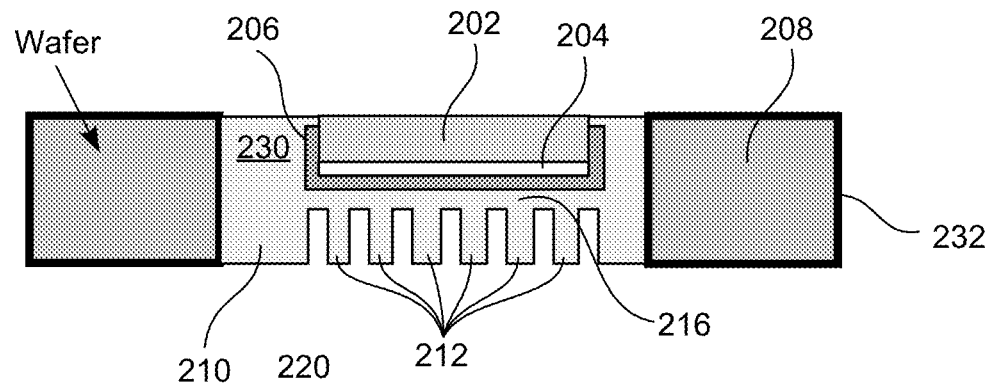
FIG. 1A
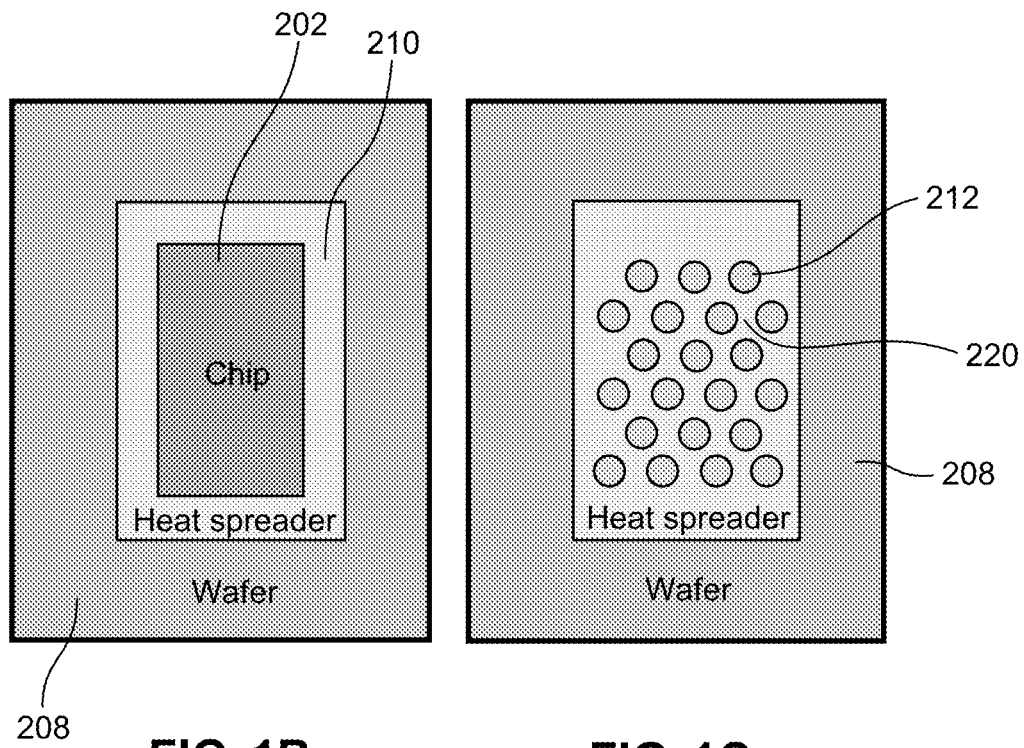
FIG. 1B  FIG. 1C

WAFER-LEVEL INTEGRATED MICRO-STRUCTURED HEAT SPREADERS

CROSS REFERENCE TO RELATED APPLICATIONS

This application claims the benefit of U.S. Provisional Patent Application No. 63/082,654 filed Sep. 24, 2020, the disclosure of which is hereby incorporated herein by reference.

GOVERNMENT LICENSE RIGHTS

This invention was made with government support under U.S. Government Contract Number FA8650-13-C-7324. The government may have certain rights in the invention.

FIELD OF INVENTION

The invention relates to heat spreaders and, specifically, to device architecture that reduces peak stress in an embedded heat spreader by micro-structuring the heat spreader while maintaining high thermal management efficacy.

BACKGROUND OF INVENTION

Metal Embedded Chip Assembly (MECA) technology is known in the art. MECA technology relies on direct electroplating of heat spreaders with high thermal conductivity, preferably copper heat spreaders, on the back of semiconductor chips. This technique enables significant improvement in thermal management and multi-chip module integration capabilities.

In particular, MECA is a wafer-scale packaging technology that integrates metallic heat spreader directly on the back of integrated chips. The MECA modules can consist of one or multiple chips with high-performance interconnects. Generally, the MECA wafer consists of 1) a body wafer (e.g., silicon, silicon carbide, alumina, or glass), 2) embedded chips (e.g., Si CMOS, III-V, alumina passives), 3) embedded heat spreaders (e.g., electroplated copper) and 4) chip-to-chip and chip-to-wafer interconnects (e.g., electroplated gold).

The following patents, which are incorporated herein by reference, describe various aspects of MECA technology, including the demonstrated advantages of embedding a chip in an embedded heat spreader: U.S. Pat. Nos. 8,617,927; 9,214,404; 9,337,124; 9,508,652; 9,842,814; U.S. patent Ser. No. 10/026,672 and U.S. patent Ser. No. 10/483,184. These patents do not address the coefficient of thermal expansion (CTE) mismatch between the embedding material, including copper which is a preferred embedding material, and the embedded semiconductor material, including silicon carbide which is the preferred embedded semiconductor material.

To date, in relying on direct electroplating of heat spreaders with high thermal conductivity on the back of semiconductor chips, MECA heat-spreader technology has used a thick metallic integrated heat spreader; a heat spreader that is solid and without voids. The inventors have recognized that CTE mismatch between the copper heat spreader and the semiconductor materials as a source of reliability failure under thermal stress. Based on this recognition, the present invention addresses critical CTE challenges between the embedding and embedded materials by tailoring the effective CTE of the heat spreader through micro-structuring technologies. This micro-structuring maintains high thermal management performance—a notable metric for MECA.

SUMMARY OF INVENTION

The coefficient of thermal expansion of copper is four times the coefficient of thermal expansion of most semiconductor substrates (e.g., silicon and silicon carbide). To address the mismatch between CTEs and to inhibit this mismatch from becoming a source of module reliability failure during operation with high thermal gradients, the inventors have invented a heat spreader architecture that can be co-integrated using, by way of example, a variant of the traditional MECA fabrication process, but locally addresses the mismatch in the coefficient of thermal expansion while maintaining high thermal heat sinking performance. The present invention provides an integrated and micro-structured heat spreader that enables high thermal efficiency while addressing the challenges in a coefficient of thermal expansion mismatch.

In accordance with one embodiment of the invention, there is provided an electronic assembly comprising:
(a) a wafer defining at least one cavity;
(b) a chip disposed in the cavity; and
(c) a metal heat spreader disposed in the cavity, the chip being embedded in the metal heat spreader;
wherein the metal heat spreader comprises at least one elongate microstructure separated from a remainder of the metal heat spreader by at least one channel;
wherein the metal heat spreader occupies an area within the cavity that is not occupied by the chip; and
wherein the at least one elongate microstructure is configured and arranged in the cavity so as to improve thermal management of the chip by reducing stress across the chip as compared with a configuration and arrangement in which a heat spreader made of the metal and occupying the area within the cavity is a solid without channels.

In accordance with a preferred aspect of this embodiment, the configuration of the metal heat spreader with the at least one elongate microstructure and the at least one channel improves thermal management by reducing peak von Mises stress across the chip by at least 2× without raising peak temperature more than 10% as compared with a configuration wherein the metal of the heat spreader fills the space within the at least one cavity without any channel.

In accordance with a preferred embodiment of the invention, there is provided an electronic assembly comprising:
a) a wafer defining at least one cavity;
b) at least one chip assembly embedded within the at least one cavity, the at least one chip assembly having a frontside and a backside and comprising a semiconductor material; and
c) a heat spreader made of a metal, the heat spreader being embedded within the at least one cavity and being configured and arranged with a first portion of the metal heat spreader attached to a wall of the wafer and surrounding the at least one chip assembly and a second portion of the metal heat spreader disposed under the backside of the at least one chip assembly and forming at least one elongate microstructure surrounded by a at least one channel.

The at least one elongate microstructure is formed either (i) directly on the backside of the chip assembly or on a metal layer connected thereto or (ii) on a base layer of the metal heat spreader that is formed directly on the backside of the chip assembly or on a metal layer connected thereto.

The metal heat spreader and the at least one channel occupy a space within the at least one cavity that is not occupied by the at least one chip assembly. The configuration of the second portion of the metal heat spreader with the at least one elongate microstructure surrounded by the at least one channel improves thermal management by reducing stress across the electronic assembly as compared with a configuration wherein a heat spreader made of the metal and occupying the space is of solid configuration without channels.

In accordance with another preferred embodiment of the invention, the at least one elongate microstructure is of cylindrical shape, the semiconductor material of the at least one chip assembly has a first coefficient of thermal expansion, the metal of the heat spreader has a second coefficient of thermal expansion, and the second coefficient of thermal expansion is multiple times greater than the first coefficient of thermal expansion. In a most preferred embodiment of the invention, the metal heat spreader comprises copper and the semiconductor material of the chip assembly is silicon or silicon carbide, preferable silicon carbide.

In yet another preferred embodiment, the first portion of the metal heat spreader surrounding the chip assembly has a width, as measured from an end of the chip assembly to a wall of the at least one cavity, of 1 to 100 microns and has a thickness, as measured from a top of the at least one cavity to a bottom of the at least one cavity, of 50 microns to 1 mm, preferably 100 microns to 1 mm.

In an embodiment wherein the at least one elongate microstructure is formed directly on the backside of the at least one chip assembly or on a metal layer connected thereto and extends to an edge of the at least one cavity, the at least one elongate microstructure has a length of about 10 to 500 microns. In an embodiment wherein the at least one elongate microstructure is formed on the base layer or baseplate and a length of the elongate microstructure extends from the base layer or base plate to an edge of the at least one cavity, the base layer has a thickness of about 1 to 150 microns and the at least one elongate microstructure has a length of about 10 to 500 microns.

In still another preferred embodiment of the invention, the wafer is made from a material selected from the group consisting of silicon, quartz, PolyChlorinated Biphenyls (PCBs), Fiberglass reinforced epoxy laminates, Silicon Carbide (SiC) and polymer.

In yet another embodiment of the invention, the metal heat spreader is configured and arranged to form a plurality of elongate microstructures within the at least one cavity with each of the plurality of elongate microstructures surrounded by at least one channel, and wherein each of the plurality of elongate microstructures is attached either (i) directly on the backside of the chip assembly or on a metal layer connected thereto or (ii) on a base layer of the metal heat spreader that is formed directly on the backside of the chip assembly or on a metal layer connected thereto. In a preferred aspect of this embodiment, each of the plurality of elongate microstructures has a diameter of about 10 to 500 microns and each of the channels between the plurality of elongate microstructures is about 10 to 500 microns in width. In yet another aspect of this embodiment, the plurality of elongate microstructures are uniformly spaced across the backside of the at least one chip assembly.

In still another embodiment of the invention, the wafer also defines at least a second cavity, wherein at least a second chip assembly is disposed within the at least second cavity, wherein the second chip comprises a semiconductor material, a frontside and a backside, and wherein a second heat spreader comprising the metal is embedded in the at least second cavity. The second heat spreader comprises a second plurality of elongate microstructures surrounded by at least one channel, and each of the second plurality of elongate microstructures is formed either (i) directly on the backside of the chip assembly or on a metal layer connected thereto or (ii) on a base layer of the metal heat spreader that is formed directly on the backside of the chip assembly or on a metal layer connected thereto. In this embodiment, the second heat source has a higher power density than the first heat source, and the second plurality of elongate microstructures are configured to provide the second heat spreader with a lower coefficient of thermal expansion than the coefficient of thermal expansion of the heat spreader embedded in the at least one cavity. The electronic assembly can comprise at least one interconnect coupling the at least first chip assembly to the at least second chip assembly.

In yet another preferred embodiment of the invention, the configuration of the metal heat spreader with the at least one elongate microstructure and the at least one channel improves thermal management by reducing peak von Mises stress across the at least one chip assembly by at least 2× without raising peak temperature more than 10% as compared with a configuration wherein the metal of the heat spreader fills the space within the at least one cavity without channels.

In a further embodiment of the invention, there is provided a method of forming the electronic assembly with the at least one elongate micro-structure formed on the base layer comprising the steps of:
  i. embedding the at least one chip assembly in the wafer with the at least one cavity;
  ii. metallizing the backside of the at least one chip assembly;
  iii. electroforming the base layer of the metal heat spreader onto the backside of the at least one chip assembly;
  iv. electroforming the at least one elongate micro-structure onto the base layer through a resist mold; and
  v. removing the resist mold to form the electronic assembly.

BRIEF DESCRIPTION OF THE DRAWING FIGURES

FIG. 1A is a cross section of an electronic assembly of the invention in a preferred embodiment comprising a module with a wafer defining a cavity having a heat spreader and a chip embedded therein, wherein a base layer ("baseplate") of the heat spreader is formed on a backside of the chip and microstructures of the heat spreader are formed on the base layer.

FIG. 1B is a top view of the electronic assembly of FIG. 1A.

FIG. 1C is a bottom view of the electronic assembly of FIG. 1A.

Figure 2A:
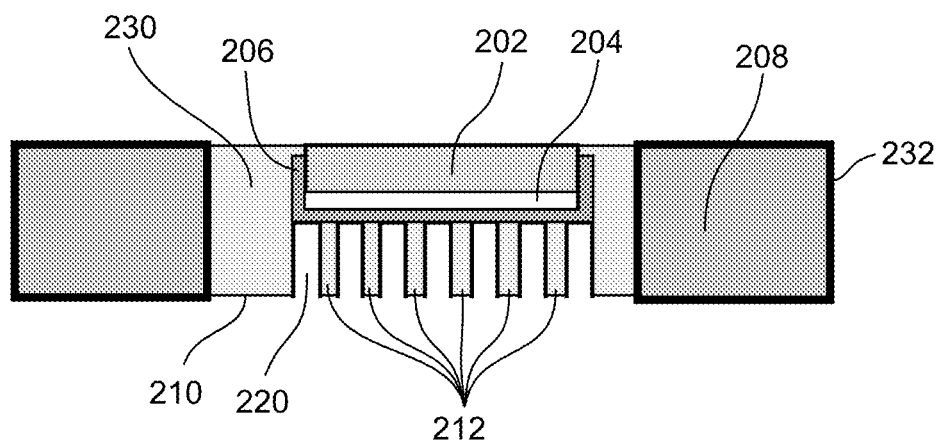
FIG. 2A is a cross section of an electronic assembly of the invention in a preferred embodiment wherein microstructures of the heat spreader are formed directly on a metal layer on the backside of the chip.
Figure 7A:
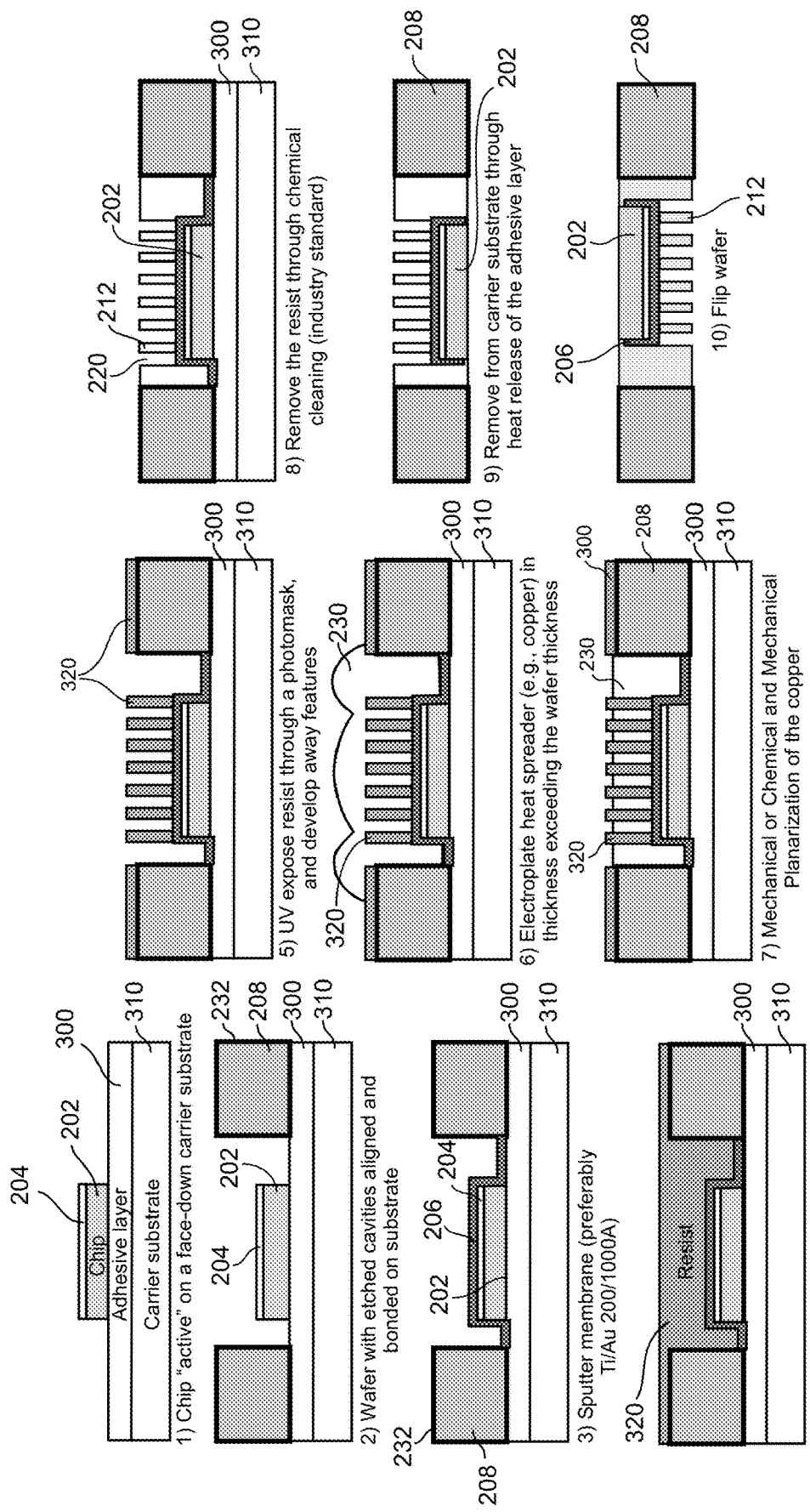
Figure 7B:
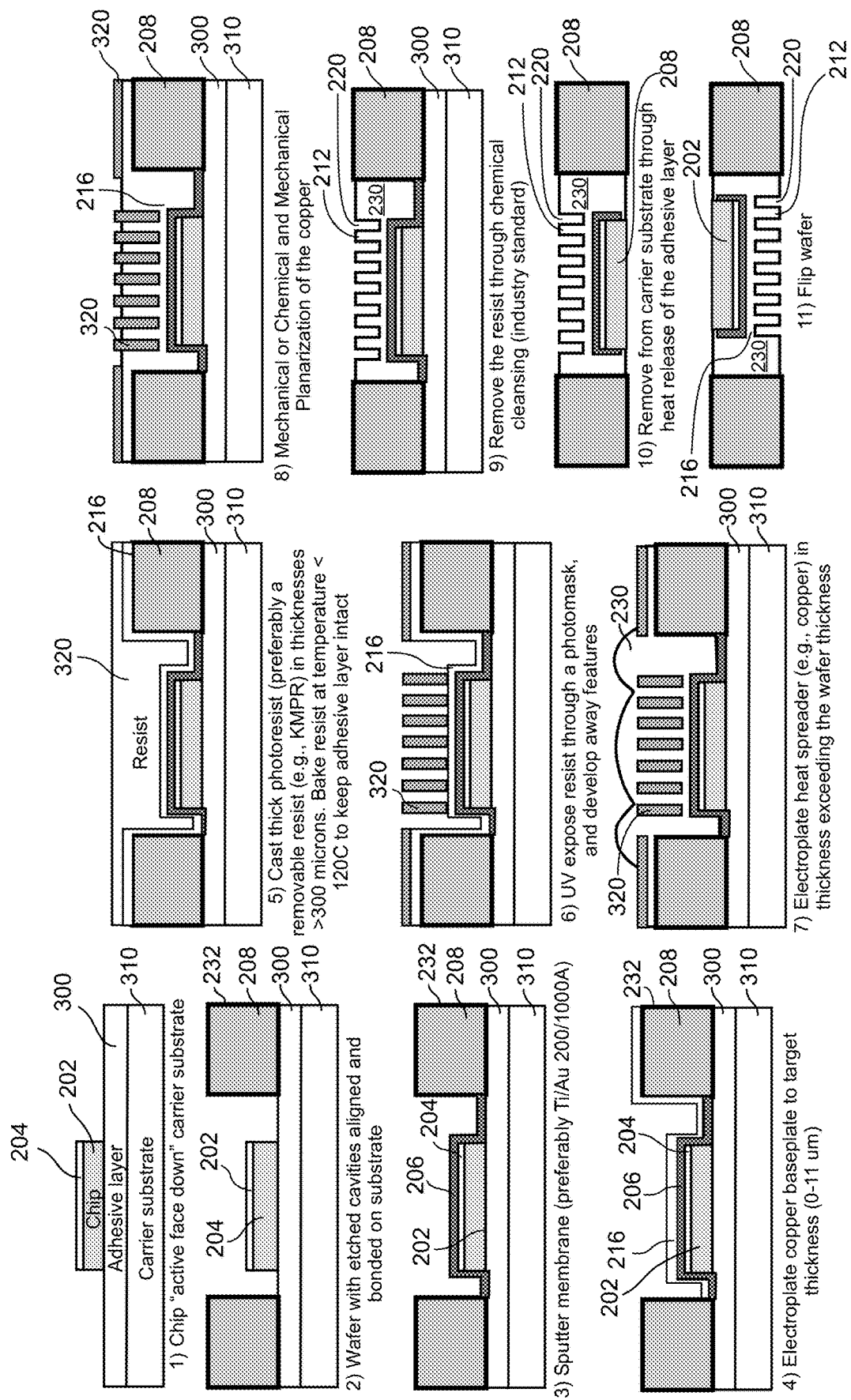

FIG. 7A is a depiction of a preferred method for preparing the electronic assembly of the invention shown in FIG. 2A, wherein microstructures of the heat spreader are formed directly on the backside of the chip. FIG. 7B is a depiction of a preferred method for preparing the electronic assembly of the invention shown in FIG. 2B, wherein microstructures of the heat spreader are formed on a baseplate formed on the backside of the chip.

Figure 8:
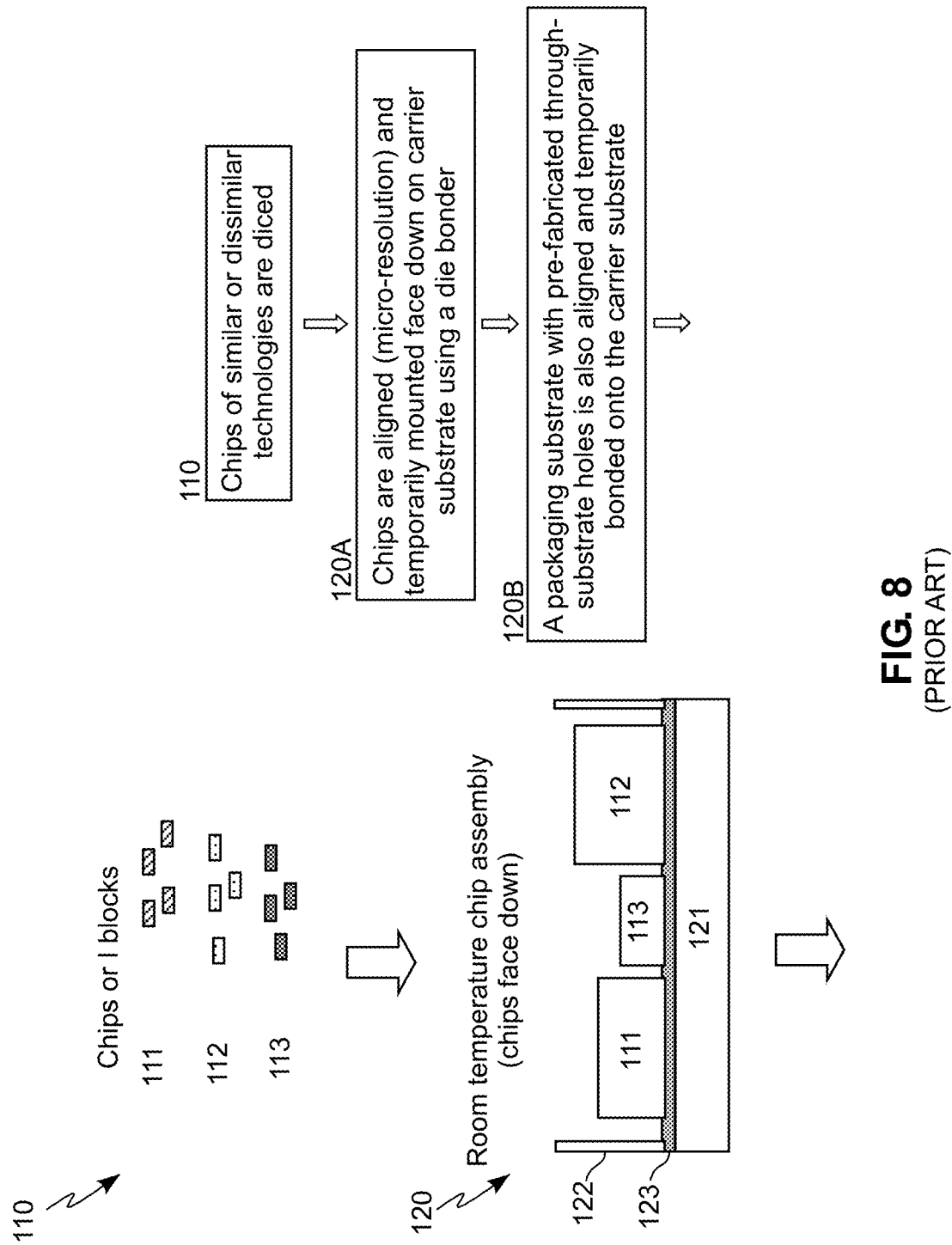
Figure 9:
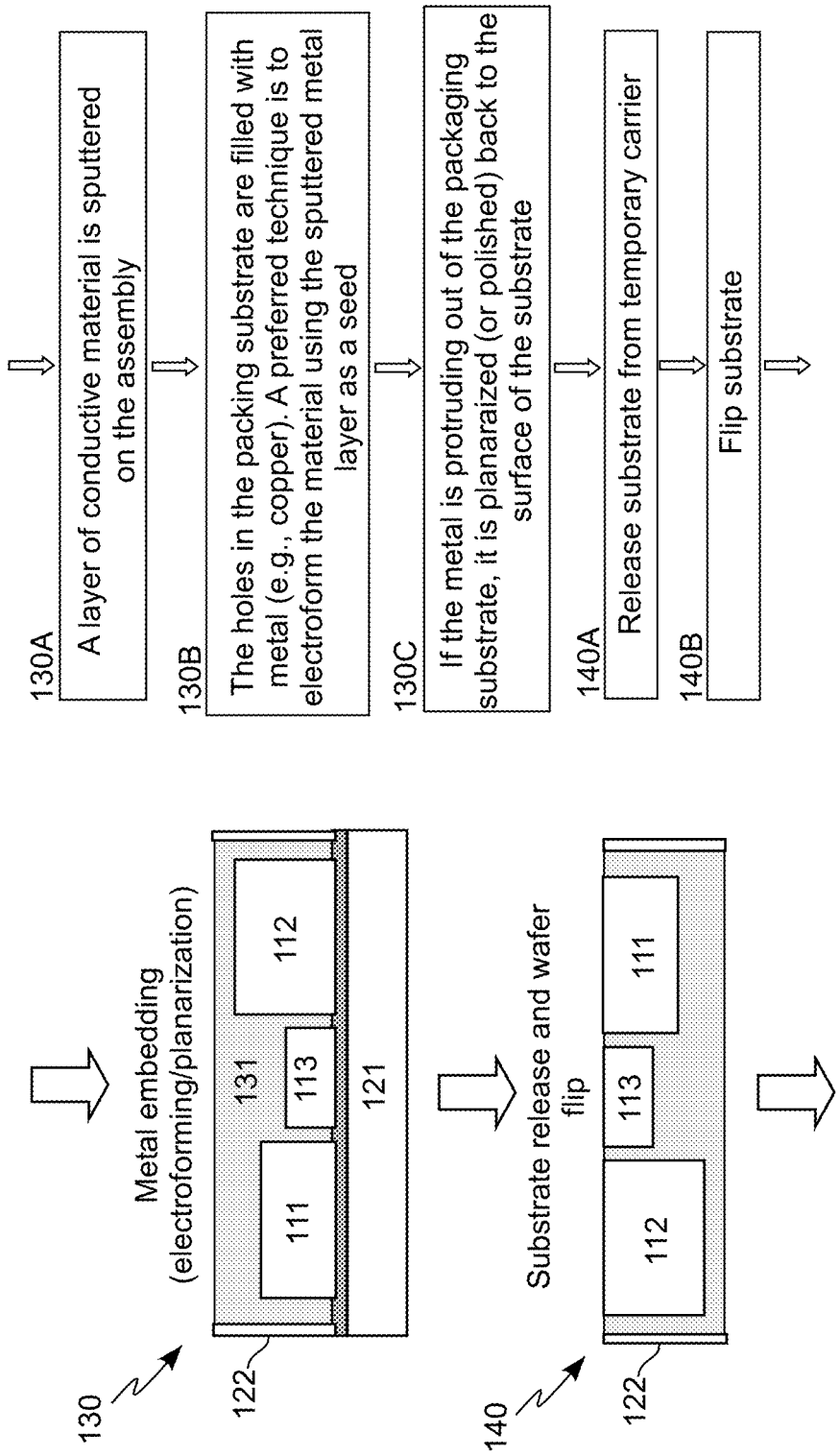

FIG. 8 and FIG. 9 illustrate detailed steps of a traditional process for metal embedded chip assembly (MECA).

DETAILED DESCRIPTION

The present invention provides an electronic assembly comprising an embedded heat spreader having a novel architecture that reduces the effective coefficient of thermal expansion (CTE) of the heat spreader, while maintaining superior effective thermal conductivity (Tc) of the heat spreader. The novel architecture comprises a microstructured heat spreader that is compatible with the traditional MECA wafer-scale fabrication process, which is described next.

MECA technology presents a recursive technology for heterogeneous integration of multiple die from diverse device technologies. The "recursive" aspect of this integration technology enables integration of increasingly-complex subsystems while bridging different scales for devices, interconnects and components. Additionally, high thermal management performance is maintained through the multiple recursive levels of the technology, a key requirement for high-performance heterogeneous integration of digital, analog mixed signal and RF subsystems.

MECA technology effectively replaces prior art wire bonding techniques with a new die to package and die to die interconnects which may be conveniently suspended over electrically conductive surfaces, including integrated heat sinks (or heat spreaders), which may be included in the packaging. The technology is particularly suitable for wafer-level integration and wafer-level processing, which enables parallel interconnection of a multitude of chips at the wafer scale.

The traditional MECA process flow in described with respect to FIGS. 8 and 9. The first step 110 in the MECA process is to dice the IC chips or the IP blocks or macros that need to be put together and interconnected in the MECA process. They can be from one or more different technologies or from the same technology family.

In the illustration of FIG. 8, 111 represents a die from an IC chip, while 112 is another die from a different technology and 113 is an IP Macro. They are first diced in step 110. Next step 120 comprises of several sub-steps 120A and 120B. In step 120, IC chips and a mesh wafer (packaging form 122) are temporarily bonded face down on a carrier wafer coated with adhesive. In step 120A, the dies of chips and macros are mounted on a carrier substrate face down and temporarily bonded with an adhesive 123 using a die bonder. Next (in step 120B), a pre-fabricated packaging form 122 with pre-fabricated through-substrate holes is installed, aligned and temporarily bonded onto the carrier substrate 121. This chip assembly on the substrate can take place at room temperature with a die bonder. The packaging form 122 can be made from a substrate or other suitable material.

FIG. 9 illustrates the next two steps 130 and 140 in the traditional MECA process. In step 130, at the wafer level, a high-thermal conductivity (e.g., copper) heat spreader is electroformed on the backside of the chips, enabling high-density chip integration as well as high-performance thermal management due to the intimate contact between the heat spreader and the chips. Step 130 comprises three sub-steps. In step 130A, a layer of a conductive material is sputtered on the assembly from the step 120B. The conductive material is preferably a combination of a material with good adhesion properties (such as Ti, Cr, TaN, Ta or TiN) and a low resistance material for seeding (such as Au or Cu), In the next step 130B, the holes in the packaging substrate 122 are filled with a metal such as copper. In a preferred embodiment, the sputtering of metal in the step 130A is used as a seed layer and then the material of choice is electroformed on top of this seed layer. Planarization (step 130C) takes place after electroforming, to remove any protruding metal. One can use polishing instead or in addition in step 130C to get rid of the protruding metal out of the package and to get a smooth finish. Next step 140A involves releasing the substrate 122 from the temporary carrier by any known means, followed by flipping the substrate (step 140B) to get the IC chips and macros face up and embedded in the metal heat sink 131.

As can be seen in FIG. 9, traditional MECA heat-spreader technology has produced a thick metallic integrated heat spreader; a heat spreader that is solid and without voids. In contrast, the heat spreader of the present invention comprises elongate microstructures with spaces, channels or voids therebetween. These terms are used interchangeably herein to refer to spaces between the elongate microstructures.

FIGS. 1A-1C provide a rendering of the novel architecture of an electronic assembly of the invention in a preferred embodiment. These figures show a wafer or package form 208 defining a cavity in which is disposed a chip or chip assembly 202. The chip or chip assembly can comprise, by way of example, one or more of a die from an IC chip, another die from a different technology and an IP Macro, as in traditional MECA technology (see FIG. 8). A plate 204 comprising gold or another material, such as copper, and a layer of sputtered material 206 are optionally disposed sequentially on the backside of the chip or chip assembly 202 to aid in initiating the electroforming of the heat spreader. The sputtered material 206 can comprise, by way of example, Ti, Ta, TaN, TiN or Cr either alone or in combination with a conductive layer, such as Au or Cu. A layer of the sputtered material 232 may be deposited on wafer 208 as well.

As shown in FIGS. 1A-1C, a heat spreader 230 is disposed in the cavity defined by the wafer 208. A first portion 210 of the heat spreader is disposed on opposites sides of chip 202 between the chip and the wafer. A second portion of the heat spreader is disposed under chip 202 and comprises a plurality of elongate microstructures 212 separated from each other by channels 220. In a first embodiment, the second portion of the heat spreader comprises a base layer or "baseplate" 216 formed on the backside of chip 202 or formed on gold plate 204 or sputtered metal layer 206 formed on the backside of chip 202. In this embodiment, the elongate microstructures 212 are formed on base layer 216. See FIGS. 1A and 2B. In a second embodiment, the elongate microstructures are formed directly on the backside of chip assembly 202 or on gold plate 204 or on the layer of sputtered metal 206 formed on the backside of chip assembly 202. See FIG. 2A.

In FIGS. 1A-1C, only a single MECA module with a single chip assembly is shown, but the architecture is fabricated at the wafer scale, with the ability to modify the heat spreader microstructure geometries based on heat points. Although the thermal models presented below rely on a single chip module with a single heat source, with the knowledge and tools available to those of skill in the art, including but not limited to Finite Element Analysis (FEA) (see Examples, supra), one of skill in the art will be able routinely to alter geometries based on the number and location of heat sources as well as chip dimensions, and to apply the description herein to make multi-chip MECA module configurations.

The terms "microstructures" and "micro pillars" are used herein interchangeably. The elongate microstructures can have different configurations with respect to geometry of the microstructures and the spaces therebetween. For instance, some microstructures may be pillars of cylindrical shape while others may have the shape of a rectangular prism. Some microstructures may have narrow spaces therebetween while other microstructures many have wider spaces therebetween, or the microstructures may have both wide and narrow spaces therebetween. Some microstructures may have straight, smooth surfaces while others may have surfaces with ridges, fins or other microsized protrusions and are referred to herein as "microstructured". In a preferred embodiment of the invention, the elongate microstructures have a length in a range of about 10 to 500 microns and each of the channels between the plurality of elongate microstructures is about 10 to 500 microns in width.

As discussed above, the heat spreading micro pillars are preferably located within a MECA module or other cavity under the chips. FIG. 2A shows a configuration where the heat spreading microstructures can directly contact the backside of the chip. This embodiment of the invention can be prepared, by way of example, as shown in FIG. 7A.

As shown in FIG. 7A, the process comprises first temporarily bonding a chip assembly 202 onto a carrier substrate 310 with an adhesive layer 300 (FIG. 7A, step 1) and then aligning and temporarily bonding a wafer 208 with etched cavity onto the carrier substrate (FIG. 7A, step 2). This is followed by a step (FIG. 7A, step 3) of sputtering a membrane or film 206 onto the backside of the chip assembly to provide a continuous electrical path for electroplating the heat spreader onto the backside of the chip assembly in a subsequent step. The backside of the chip assembly optionally comprises a plate 204 of gold or other material and, if present, the membrane 206 is sputtered thereon (FIG. 7A, step 3). The optional gold plate preferably has a thickness between about 1-10 microns and most preferably has a thickness of about 5 microns. The membrane comprises a material such as Ti/Au having a thickness of preferably about 200/1000 A with a range of 100-500 A to 500 to 10000 A. The wafer may also be coated with a film which may be Ti/Au having a thickness within the same range (FIG. 7A, step 3). These steps are the same as steps in a traditional MECA process and may be carried out using the same materials and in the same manner.

The next steps (FIG. 7A, steps 4 and 5) differ from the traditional MECA process steps in that, prior to electroplating the heat spreader into the cavity to embed the chip, a thick photoresist 320, preferably a removable resist such as a KMPR® brand resist manufactured by MicroChem Corp. of Westborough, Mass., is cast atop the chip in thicknesses of greater than 300 microns (FIG. 7A, step 4). Then, a light source emitting, for example, ultraviolet light, is used to expose the resist through a photomask so that the exposed photoresist can be dissolved with a chemical developer (FIG. 7A, step 5). Subsequently, a heat spreader 230, such as copper, is electroformed into the cavity using the sputtered metal layer as a seed as in a traditional MECA process (FIG. 7A, step 6) and the heat spreader is then planarized by mechanical or chemical and mechanical means back to a top surface of the wafer, also as in a traditional MECA process (FIG. 7A, step 7). The remaining resist is then removed by chemical cleaning according to known methods to form the microstructures with channels therebetween (FIG. 7A, step 8).

Then, the wafer with heat spreader microstructures 212 and embedded chip can be removed from the carrier substrate through heat release of the adhesive layer (FIG. 7A, step 9) and the wafer can be flipped (FIG. 7A, step 10). As shown in step 10 of FIG. 7A and FIG. 2A, the backside of the chip assembly formed after flipping the wafer in the process depicted in FIG. 7A comprises the membrane material 206 with the elongate microstructures 212 of the heat spreader formed thereon.

Figure 2B:
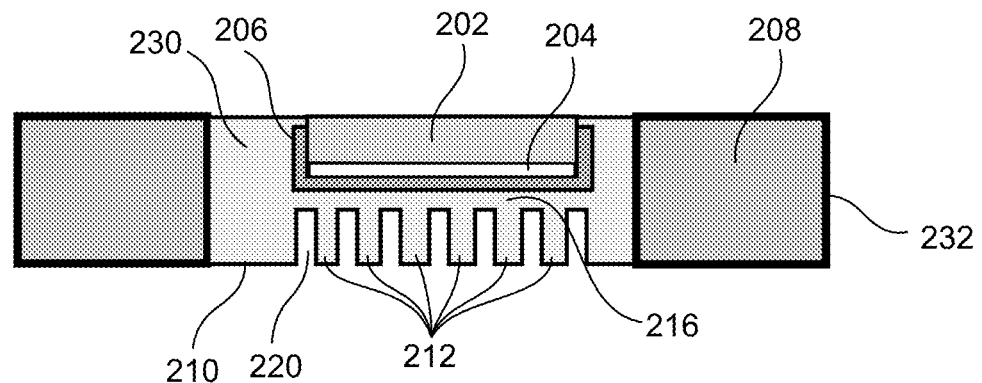
FIG. 2B is another preferred embodiment wherein microstructures of the heat spreader are formed on a baseplate formed on a metal layer on the backside of the chip.

FIG. 2B shows an alternative configuration of the electronic assembly where the microstructures 212 interface with a metallic layer or "baseplate" 216 of the heat spreader embedded in the volume of the wafer. This embodiment of the invention can be prepared, by way of example, as shown in FIG. 7B. The steps of the process described in FIG. 7B are the same as the steps of the process described in FIG. 7A with the exception that the FIG. 7B process comprises an additional step of electroplating a baseplate 216 into the cavity (FIG. 7B, step 4) prior to the step of casting the photoresist into the cavity atop the chip. The remaining steps are the same. As shown in step 11 of FIG. 7B and FIG. 2B, the backside of the chip assembly formed using the process depicted in FIG. 7B after the wafer is flipped comprises the baseplate 216 with the elongate microstructures 212 of the heat spreader formed thereon.

After flipping the respective wafers formed in the processes shown in each of FIGS. 7A and 7B, further traditional MECA processes can be performed. Chip delayering can be performed to expose the pads for interconnect and to form the interconnects, front side processing can be performed to form multi-layer interconnects, including use of standard IC process technologies and standard micro fabrication technologies to realize high-resolution front side chip-to-chip and chip-to-package interconnects. Then, the individual MECA modules can be diced as desired and can be further packaged using the same integration approach at a larger scale.

In the recursive MECA process, each of the component modules can comprise at least one of an assembly prepared using the metal embedded chip assembly (MECA) process, an Integrated Circuit (IC) chip, a macro cell, and a die. For example, two or more MECA modules can be fabricated using the process illustrated above. The modules, which feature different IP blocks, and typically different die and interconnect scales, can then be integrated using the recursive MECA approach, which is a structured repeat of the process described above.

Examples of wafer or packaging form materials include silicon, quartz, polychlorinated biphenyls (PCB), FR4, SiC, metal plates and various polymers. The preferred substrate thickness is around 200 um thick. The substrate thickness typically ranges from 50-3000 um and is preferably at least about 10 um thicker than the thickest chip to be integrated. The substrate cavity size is typically at least 1 um larger than the chip array dimensions. The thickness of the recursive packaging substrate must be at least 1 micron thicker than the thickness of the thickest MECA sub-modules.

Examples of heat spreader materials include copper, gold, silver, copper alloys, copper-diamond, copper-CNT, and other high thermal conductivity materials or composites known by experts in the field. The heat spreaders have thickness similar to the packaging substrate stated earlier. Heat spreaders are typically deposited using deposition techniques such as Electroplating/Electroforming.

Interconnect materials are materials with high electrical conductivity such as gold, copper or silver or combination alloys thereof for the conductors and BCB, SU-8, polyimide, air, $SiO_2$, SiN and $Al_2O_3$ or combination thereof for the dielectric layers that feature low dielectric loss tangent. Interconnect materials used for conductors and dielectrics can vary in thickness from 0.1 to 500 um with a preferred thickness of 5 um for conductors and 3 um for dielectrics. The width/pitch can vary from 0.5 to 500 um (preferred 25 um). Deposition techniques such as electroplating, sputtering, or evaporation for the metallic conductors can be used. For the dielectrics, spin coating, PECVD or ALD processes can be used to deposit the dielectrics.

Carrier substrate materials can be silicon, glass or other materials with low surface roughness. The IC chips or macros can be made from SiC, Si, SiGe, GaAs, InP, alumina, PCB or other materials known in the art. The substrate can have width or length ranging from 0.025 mm to 25 mm and thickness ranging from 1 to 1000 um.

An example of an interconnect process for chip-to-chip or chip-to-board interconnects can use the following process steps and technologies or variants thereof: (1) Sputter a metal seed layer or membrane (example is Ti/Au for a thickness preferably of 200/1000 A with a range of 100-500 A to 500 to 10000 A respectively); (2) Spin coat and pattern a layer of photoresist; (3) Plate gold (preferably 3 um, with range from 1 to 10 um) to form metal 1 layer interconnects; (4) Strip resist and etch metal seed layer (e.g.: ion mill or wet etching); (5) Spin coat or deposit a dielectric layer (e.g., BCB, SU-8, $SiO_2$, SiN) with thickness of 0.1 to 10 um (preferably 3 um); (6) Pattern the layer using photo-definition, or dry etch techniques to open up regions on the plated gold to be contacted from metal 1 layer interconnects to metal 2 layer interconnects; (7) Sputter a new metal seed layer; (8) Spin coat and pattern a layer of photoresist to create metal 2 layer; (9) Plate gold (preferably 5 um) with thickness ranging 0.5 to 500 um to form "metal 2 layer" interconnects; (10) Strip resist and etch metal seed layer.

The technology in this disclosure offers methods to develop a low-cost and manufacturable wafer-level integration technology for various systems including RF subsystems. It addresses thermal management and other limitations in high-frequency subsystems featuring high-power-density active devices such as GaN devices and GaN RF MMIC circuits.

The microstructured heat spreaders described and claimed herein have low effective CTE and high effective Tc. This enables them to provide performance enhancement over the traditional MECA approach. The method of fabrication is compatible with wafer-level integration, similar to MECA. The architecture can be tailored based on the module design to maximize thermal and mechanical performance. In particular, the location of the high-thermal-conductivity micro pillars under the heat sources on the chips can be optimized. The use and advantages of the invention described herein are exemplified in the Examples which follow next.

EXAMPLES

Figure 3:
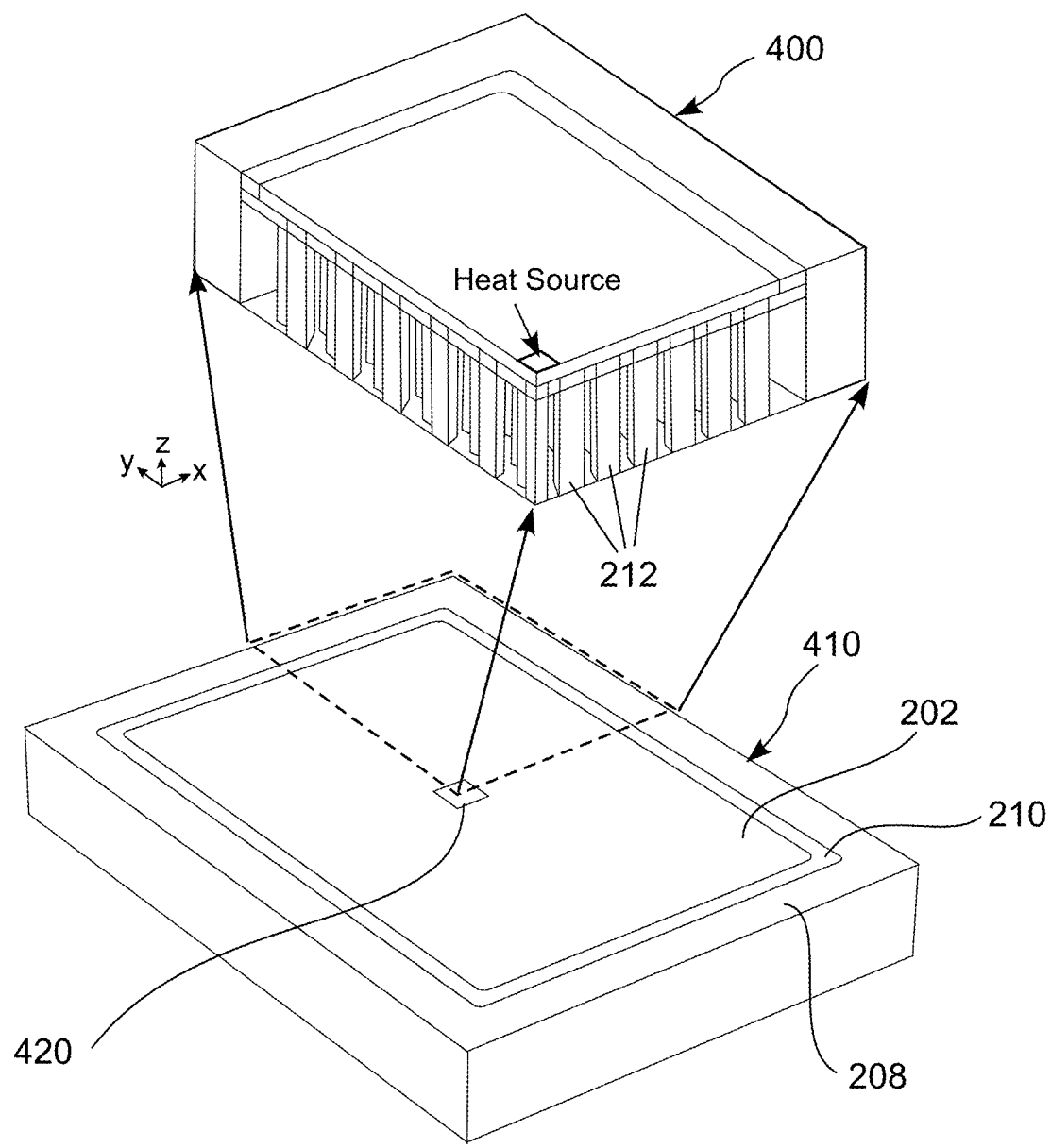
FIG. 3 is a perspective view of a model used for finite element analysis of an electronic assembly of the invention.

FIG. 3 provides an example of a 3D model that can be used for Finite Element Modeling of an embedded chip with micro pillars in accordance with the invention. In FIG. 3, model 400 with micro pillars 212 is depicted modeling assembly 410. Assembly 410 comprises embedded chip 202, heat spreader 210 and wafer 208. Because of symmetry, only a quarter of the structure 410 needs to be modeled. In this example, the heat source 420 was applied at the center of a 50-um chip 202 that was 2 mm×3 mm. The heat spreader 210 was surrounding the chip by an additional 100 um on each side, and is 300 um thick. The heat spreader 210 ranges from 100 um to 1 mm in thickness.

In accordance with the invention, micro pillars are preferably electroformed with the metallic heat spreader and range from 10 um diameter to 500 um diameter, with a spacing between the pillars from 10 um to 500 um. The thickness of the baseplate can range from 0 microns to 1 mm. When the thickness of the baseplate is 0 microns, the micro pillars are formed directly on the back of the embedded chip as in FIG. 2A. When the thickness of the baseplate is 1 mm, the metal of the heat spreader occupies the entire space of the cavity that is not occupied by the embedded chip such that there are no micro pillars.

Figure 4:
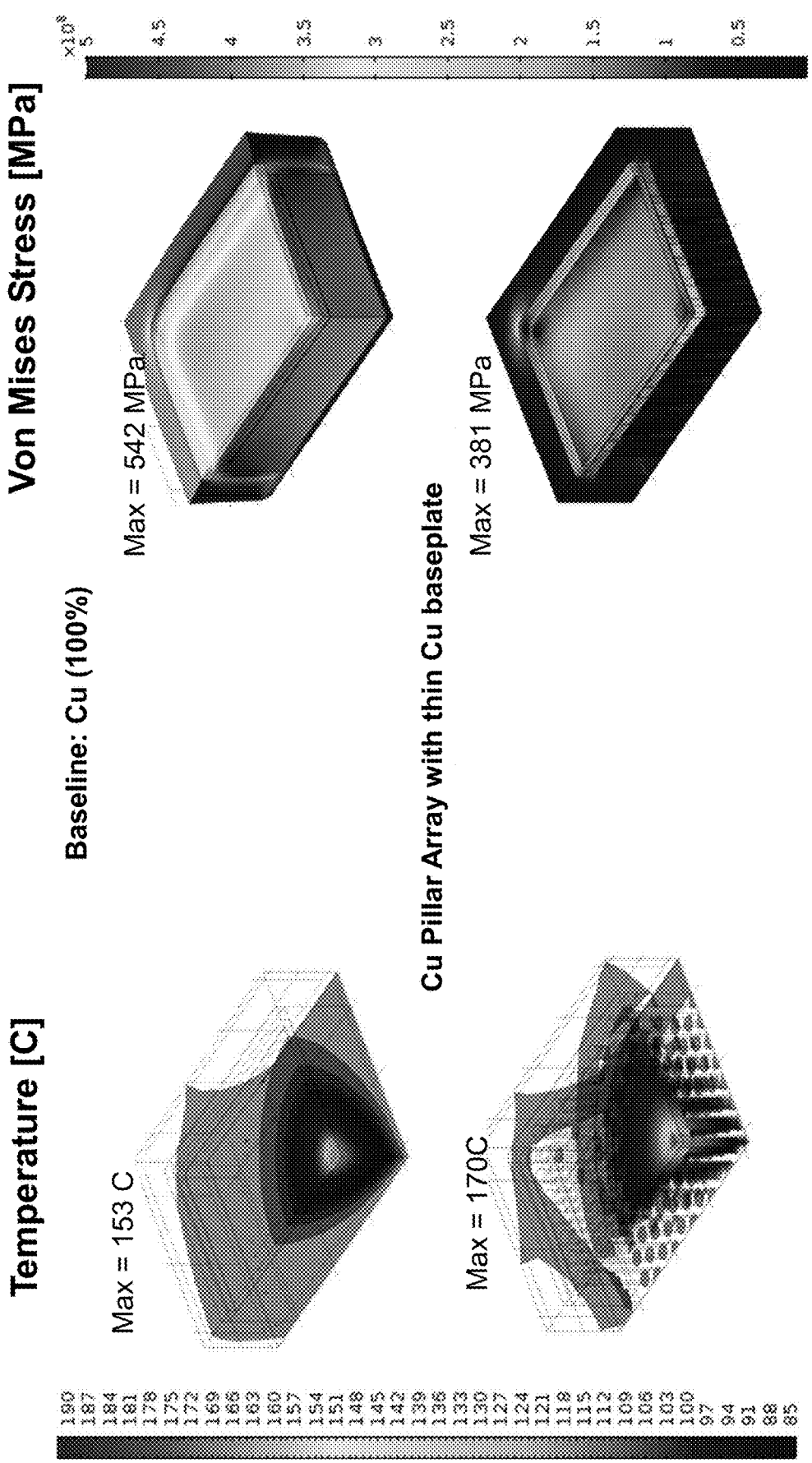
FIG. 4 is a depiction of a simulation result comparing the temperature and von Mises stress on the chip module of an electronic assembly having an embedded copper heat spreader of the invention with an electronic assembly having an embedded copper heat spreader of the prior art.

FIG. 4 shows a simulation result comparing the baseline MECA model (100% copper) of the prior art with a micro pillar configuration of the invention. The figure shows a modeling with heat source power density of 300 MW/m$^2$, or approximately 6 W in this example. The bottom plate is held constant at 65 C in this simulation, and air is surrounding the model. As illustrated in FIG. 4, the selected micro-pillar configuration significantly reduces peak and average Von Mises stress while the peak temperature goes up by approximately 17 C.

Figure 5A:
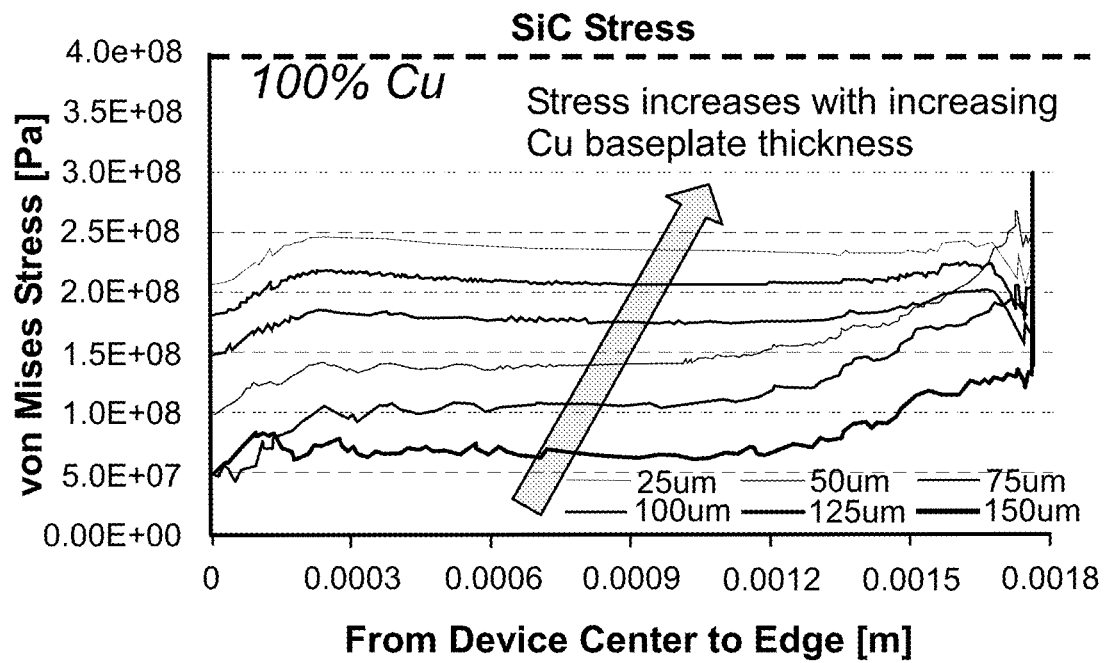
FIG. 5A is a graph showing the von Mises stress on a chip module comprising a silicon carbide substrate and an embedded copper heat spreader of the invention as the base plate of the heat spreader increases in thickness.
Figure 5B:
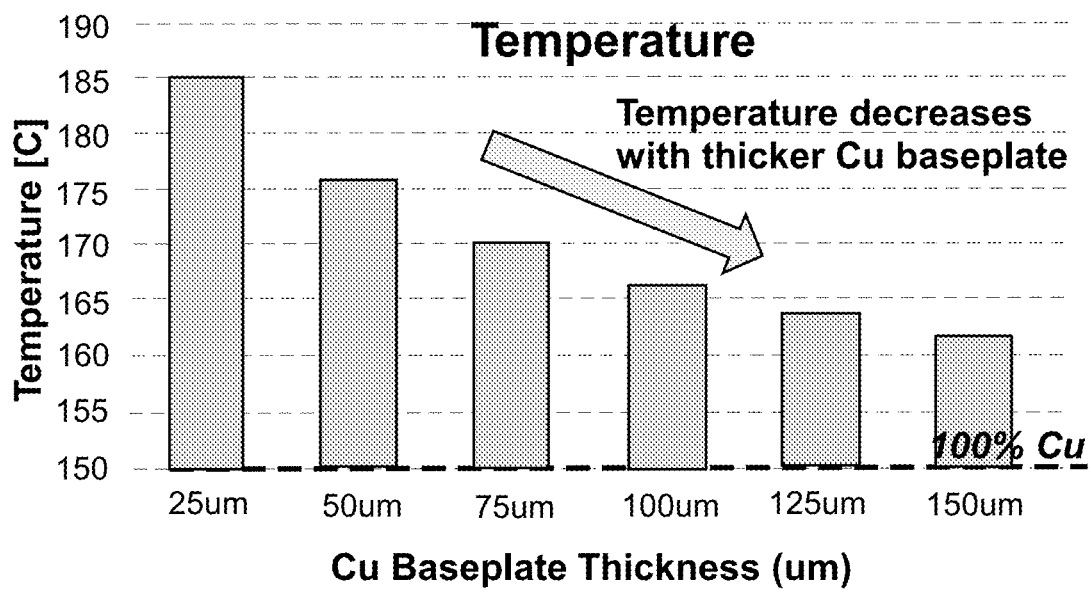
FIG. 5B is a graph showing the effect on temperature of the chip module as the base plate of the heat spreader increases in thickness.

FIG. 5A shows stress along the axial length of the ¼ model where zero is the center of the module (heat source), and 0.0018 is the edge of the module. FIG. 5B shows the peak temperature simulated for different thickness of the baseplate under the chip. The overall module thickness is held constant. As such, the micro pillar height equals module thickness minus embedded chip thickness minus baseplate thickness.

From the results shown in FIGS. 5A and 5B, it can be seen that there are design trade-offs based on thermal performance and average stress. Depending on the reliability constraints of the application, one can optimize peak performance or prolonged performance. The results are compared against the baseline case (100% Cu baseplate, no micro-pillars).

Figure 6A:
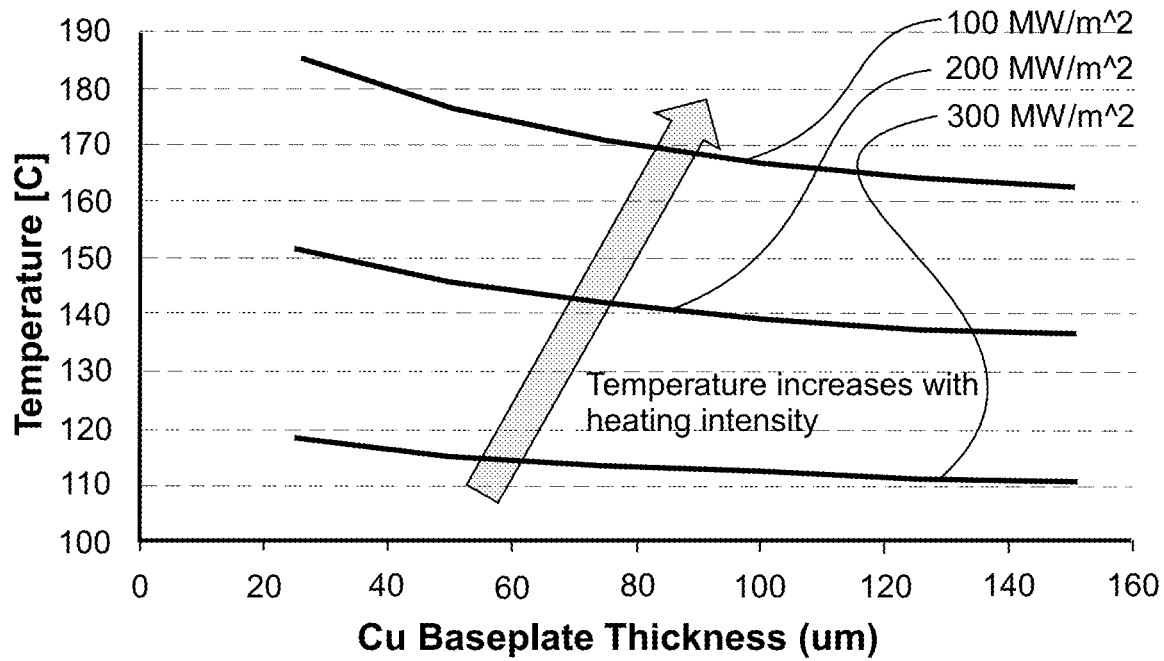
FIG. 6A is a graph showing the effect on temperature of a chip module with heat source embedded in a heat spreader of the invention as the thickness of the base plate and the power of the heat source increase.
Figure 6B:
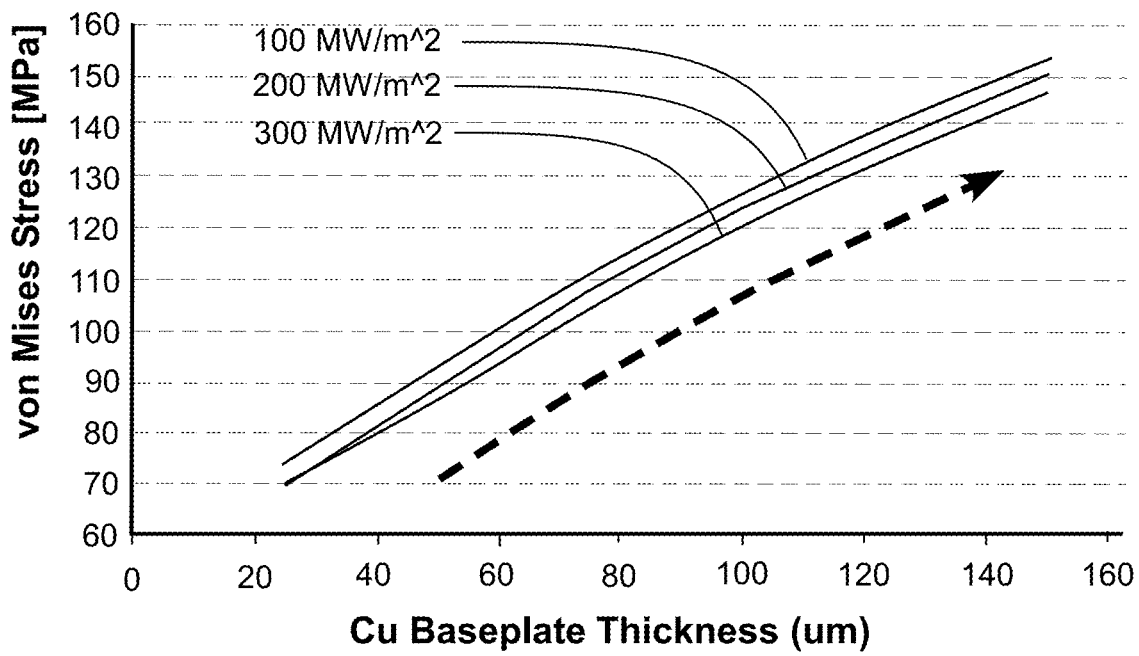
FIG. 6B is a graph showing the effect on von Mises stress of the chip module as the thickness of the base plate and the power of the heat source increase.

FIGS. 6A and 6B show the effect of heat source dissipated power and show that the models hold with increased power resulting in higher temperature and higher stress.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

What is claimed is:

1. An electronic assembly comprising:
   (a) a wafer defining at least one cavity;
   (b) a chip disposed in the at least one cavity; and
   (c) a metal heat spreader disposed in the at least one cavity, the chip being embedded in the metal heat spreader;
   wherein the metal heat spreader comprises at least one elongate microstructure separated from a remainder of the metal heat spreader by at least one channel, the at least one elongate microstructure comprising one end detached from any other structure;
   wherein the metal heat spreader occupies an area within the cavity that is not occupied by the chip; and
   wherein the at least one elongate microstructure is configured and arranged in the cavity so as to improve thermal management of the chip by reducing stress across the chip as compared with a configuration and arrangement in which a heat spreader made of the metal and occupying the area within the cavity is a solid without channels.

2. The electronic assembly according to claim 1, wherein a configuration of the metal heat spreader with the at least one elongate microstructure and the at least one channel improves thermal management by reducing peak von Mises stress across the chip by at least 2× without raising peak temperature more than 10% as compared with a configuration wherein the metal of the heat spreader fills the space within the at least one cavity without any channel.

3. The electronic assembly according to claim 2, wherein the chip assembly comprises one or more of a die from an IC chip, another die from a different technology and an IP Macro.

4. An electronic assembly comprising
   a. a wafer defining at least one cavity;
   b. at least one chip assembly embedded within the at least one cavity, the at least one chip assembly having a frontside and a backside and comprising a semiconductor material; and
   c. a heat spreader made of a metal, the heat spreader being embedded within the at least one cavity and being configured and arranged with a first portion of the metal heat spreader attached to a wall of the wafer and surrounding the at least one chip assembly and a second portion of the metal heat spreader disposed under the backside of the at least one chip assembly and forming at least one elongate microstructure surrounded by at least one channel, the at least one elongate microstructure comprising one end detached from any other structure;
   wherein the at least one elongate microstructure is formed either (i) directly on the backside of the chip assembly or on a metal layer connected thereto or (ii) on a base layer of the metal heat spreader that is formed directly on the backside of the chip assembly or on a metal layer connected thereto;
   wherein the metal heat spreader and the at least one channel occupy a space within the at least one cavity that is not occupied by the at least one chip assembly; and
   wherein a configuration of the metal heat spreader with the at least one elongate microstructure surrounded by the at least one channel improves thermal management by reducing stress across the electronic assembly as compared with a configuration wherein a heat spreader made of the metal and occupying the space is a solid configuration without channels.

5. The electronic assembly according to claim 4, wherein the at least one elongate microstructure is of cylindrical shape.

6. The electronic assembly according to claim 5, wherein the metal heat spreader comprises copper.

7. The electronic assembly according to claim 5, wherein the semiconductor material of the chip assembly comprises silicon, silicon carbide, GaN, GaAs, InP or SiGe.

8. The electronic assembly according to claim 7, wherein the semiconductor material of the chip assembly comprises silicon carbide.

9. The electronic assembly according to claim 4, wherein the first portion of the metal heat spreader surrounding the chip assembly has a width, as measured from an end of the chip assembly to a wall of the at least one cavity, of 1 to 100 microns and has a thickness, as measured from a top of the at least one cavity to a bottom of the at least one cavity, of 100 microns to 1 mm.

10. The electronic assembly according to claim 4, wherein the at least one elongate microstructure is formed directly on the backside of the at least one chip assembly or on a metal layer connected thereto and extends to an edge of the at least one cavity.

11. The electronic assembly according to claim 10, wherein the at least one elongate microstructure has a length of about 10 to 500 microns.

12. The electronic assembly according to claim 4, wherein the at least one elongate microstructure is formed on the base layer or base plate and a length of the elongate microstructure extends from the base layer or base plate to an edge of the at least one cavity.

13. The electronic assembly according to claim 12, wherein the base layer or base plate has a thickness of about 1 to 150 microns and the at least one elongate microstructure has a length of about 1 to 500 microns.

14. The electronic assembly according to claim 4, wherein the metal heat spreader is configured and arranged to form a plurality of elongate microstructures within the at least one cavity with each of the plurality of elongate microstructures surrounded by a channel.

15. The electronic assembly according to claim 14, wherein each of the plurality of elongate microstructures has a diameter of about 10 to 500 microns and each of the channels between the plurality of elongate microstructures is about 10 to 500 microns in width.

16. The electronic assembly according to claim 15, wherein the plurality of elongate microstructures are uniformly spaced across the backside of the at least one chip assembly.

17. The electronic assembly according to claim 4, wherein the wafer also defines at least a second cavity, wherein at least a second chip assembly is disposed within the at least second cavity, wherein the second chip assembly comprises a semiconductor material, a frontside and a backside, wherein a second heat spreader comprising the metal is embedded in the at least second cavity, the second heat spreader comprising a second plurality of elongate microstructures surrounded by a at least one channel, wherein each of the second plurality of elongate microstructures is attached either (i) directly on the backside of the second chip assembly or on a metal layer connected thereto or (ii) on a base layer of the metal heat spreader that is formed directly on the backside of the second chip assembly or on a metal layer connected thereto, and wherein the second plurality of elongate microstructures are configured to provide the second heat spreader with a lower coefficient of thermal expansion than the coefficient of thermal expansion of the heat spreader embedded in the at least one cavity.

18. The electronic assembly according to claim 17, comprising at least one interconnect coupling the at least first chip assembly to the at least second chip assembly.

19. The electronic assembly according to claim 4, wherein the configuration of the metal heat spreader with the at least one elongate microstructure and the at least one channel improves thermal management by reducing peak von Mises stress across the at least one chip assembly by at least 2× without raising peak temperature more than 10% as compared with a configuration wherein the metal of the heat spreader fills the space within the at least one cavity without channels.

20. The electronic assembly according to claim 4, wherein the wafer is made from a material selected from the group consisting of silicon, quartz, PolyChlorinated Biphenyls (PCBs), fiberglass reinforced epoxy laminates, Silicon Carbide (SiC) and polymer.

21. A method of forming the electronic assembly according to claim 4 comprising the steps of:
   a. mounting the at least one chip assembly and a wafer on a carrier substrate with the at least one chip assembly aligned with at least one cavity in the wafer;
   b. metallizing a backside of the at least one chip assembly;
   c. electroforming a base layer of a metal heat spreader onto the backside of the at least one chip assembly;
   d. electroforming at least one elongate micro-structure onto the base layer through a resist mold; and
   e. removing the resist mold to form the electronic assembly.

22. A method of forming the electronic assembly according to claim 4 comprising the steps of:
   i. embedding at least one chip assembly in a wafer with at least one cavity;
   ii. metallizing a backside of the at least one chip assembly;
   iii. electroforming a base layer of a metal heat spreader onto the backside of the at least one chip assembly;
   iv. electroforming at least one elongate micro-structure onto the base layer through a resist mold; and
   v. removing the resist mold to form the electronic assembly.

23. An electronic assembly comprising:
   a wafer defining at least one cavity;
   a chip located in the at least one cavity, the chip having on one side an electroformed metal heat spreader comprising at least one micro pillar that is embedded within the at least one cavity in a space of the cavity that is not occupied by the chip, the micro pillar being surrounded by a channel and comprising one end detached from any other structure, the micro pillar facilitating thermal and stress management of the assembly.

24. The assembly of claim 23 wherein the at least one micro pillar is microstructured.

* * * * *